(12) United States Patent
Poirier

(10) Patent No.: US 12,339,397 B2
(45) Date of Patent: Jun. 24, 2025

(54) TEMPERATURE SENSOR, LASER CIRCUIT, LIGHT DETECTION AND RANGING SYSTEM AND METHOD

(71) Applicant: ams AG, Premstätten (AT)

(72) Inventor: Sébastien Poirier, Premstätten (AT)

(73) Assignee: AMS AG, Premstätten (AT)

( * ) Notice: Subject to any disclaimer, the term of this patent is extended or adjusted under 35 U.S.C. 154(b) by 958 days.

(21) Appl. No.: 17/422,541

(22) PCT Filed: Jan. 13, 2020

(86) PCT No.: PCT/EP2020/050678
§ 371 (c)(1),
(2) Date: Jul. 13, 2021

(87) PCT Pub. No.: WO2020/148228
PCT Pub. Date: Jul. 23, 2020

(65) Prior Publication Data
US 2022/0091237 A1    Mar. 24, 2022

(30) Foreign Application Priority Data

Jan. 15, 2019 (EP) .................................... 19151871

(51) Int. Cl.
*G01S 7/481* (2006.01)
*G01K 7/01* (2006.01)
(Continued)

(52) U.S. Cl.
CPC .............. *G01S 7/4814* (2013.01); *G01K 7/01* (2013.01); *H01S 5/0428* (2013.01);
(Continued)

(58) Field of Classification Search
CPC ........ G01S 7/4814; G01S 7/484; G01S 7/497; G01K 7/01; G01K 2219/00; H01S 5/0428;
(Continued)

(56) References Cited

U.S. PATENT DOCUMENTS 4,710,631 A * 12/1987 Aotsuka ................. G03C 5/164
250/354.1
4,792,957 A * 12/1988 Kollanyi ............. H01S 5/02415
372/36
(Continued)

FOREIGN PATENT DOCUMENTS

| CN | 1499683 A | 5/2004 |
| EP | 3159982 A1 | 4/2017 |

(Continued)

OTHER PUBLICATIONS

Chinese Office Action dated Dec. 5, 2023, Chinese Application No. 202080007260.5, with English language translation 11 pages.
(Continued)

*Primary Examiner* — Nathaniel T Woodward
*Assistant Examiner* — Philip L Cotey
(74) *Attorney, Agent, or Firm* — MH2 Technology Law Group LLP

(57) ABSTRACT

In one embodiment a temperature sensor has a first sensing unit operable to provide a first pseudo-differential unipolar analog signal representing a first temperature value of a power unit, an interface circuit operable to provide a second pseudo-differential unipolar analog signal representing a second temperature value of a powered unit, a multiplexer circuit which is operable to provide a pseudo-differential unipolar multiplexed analog signal comprising the first analog signal or the second analog signal, and a first analog-to-digital converter, ADC, component operable to
(Continued)

provide a first digital signal from the multiplexed analog signal, the first digital signal comprising a digital representation of the first analog signal or the second analog signal. Therein, the operation of the first ADC component is synchronized with a control signal designed for activating the power unit.

16 Claims, 6 Drawing Sheets

(51) Int. Cl.
*H01S 5/042* (2006.01)
*H01S 5/068* (2006.01)
*H03M 1/10* (2006.01)
*G01S 7/484* (2006.01)
*G01S 7/497* (2006.01)
*H01S 5/183* (2006.01)
*H01S 5/40* (2006.01)

(52) U.S. Cl.
CPC ....... *H01S 5/06804* (2013.01); *H03M 1/1023* (2013.01); *G01K 2219/00* (2013.01); *G01S 7/484* (2013.01); *G01S 7/497* (2013.01); *H01S 5/06825* (2013.01); *H01S 5/183* (2013.01); *H01S 5/4025* (2013.01)

(58) Field of Classification Search
CPC .. H01S 5/06804; H01S 5/06825; H01S 5/183; H01S 5/4025; H03M 1/1023
See application file for complete search history.

(56) References Cited

U.S. PATENT DOCUMENTS

| | | | | |
|---|---|---|---|---|
| 4,821,273 A * | 4/1989 | Hori | .................... | H01S 5/02415 372/32 |
| 5,438,579 A * | 8/1995 | Eda | ....................... | H01S 5/0687 372/32 |
| 6,629,638 B1 * | 10/2003 | Sanchez | ............... | G01R 31/002 235/455 |
| 8,299,715 B2 * | 10/2012 | Philippbar | ......... | H05B 45/3725 315/307 |
| 8,665,130 B2 * | 3/2014 | Makinwa | ................ | H03M 1/14 341/155 |
| 9,291,496 B2 * | 3/2016 | Xu | ......................... | G01J 1/4204 |
| 10,006,806 B2 * | 6/2018 | Xu | ......................... | G01J 1/4228 |
| 2002/0070359 A1 * | 6/2002 | Kai | ......................... | H01S 5/4031 250/504 R |
| 2004/0086006 A1 * | 5/2004 | Tanikoshi | ........... | H01S 5/06804 372/29.02 |
| 2004/0136729 A1 * | 7/2004 | Robinson | ............. | H04B 10/504 398/183 |
| 2004/0240495 A1 * | 12/2004 | Akamatsu | .............. | G03B 21/16 372/32 |
| 2004/0246460 A1 * | 12/2004 | Auracher | ............ | H01S 5/06832 356/4.01 |
| 2005/0249252 A1 * | 11/2005 | Sanchez | ............... | H04B 10/564 372/38.07 |
| 2006/0072867 A1 * | 4/2006 | Kawagishi | ............ | H01S 5/0687 385/4 |
| 2007/0040717 A1 * | 2/2007 | Goetting | .......... | H03K 19/17732 341/120 |
| 2008/0319690 A1 * | 12/2008 | Meadows | ................ | G01K 7/01 374/E1.001 |
| 2013/0301680 A1 * | 11/2013 | Qiu | .......................... | G01K 7/01 374/E1.001 |
| 2014/0072004 A1 * | 3/2014 | Connolly | .............. | H01S 3/0405 372/34 |
| 2014/0341257 A1 * | 11/2014 | Bernardinis | ......... | G01D 5/2454 374/178 |
| 2018/0231645 A1 * | 8/2018 | Droz | .................... | H04N 25/773 |

FOREIGN PATENT DOCUMENTS

| | | |
|---|---|---|
| EP | 3591360 A1 | 1/2020 |
| KR | 2008-0101065 A | 11/2008 |

OTHER PUBLICATIONS

Korean Office Action dated Jul. 19, 2022, Korean Application No. 10-2021-7022708, pp. 1-9 (Including English Translation of Korean Office Action).

International Search Report and Written Opinion mailed Mar. 20, 2020 for corresponding International Application No. PCT/EP2020/050678 (Robert, Laenen), 12 pages.

* cited by examiner

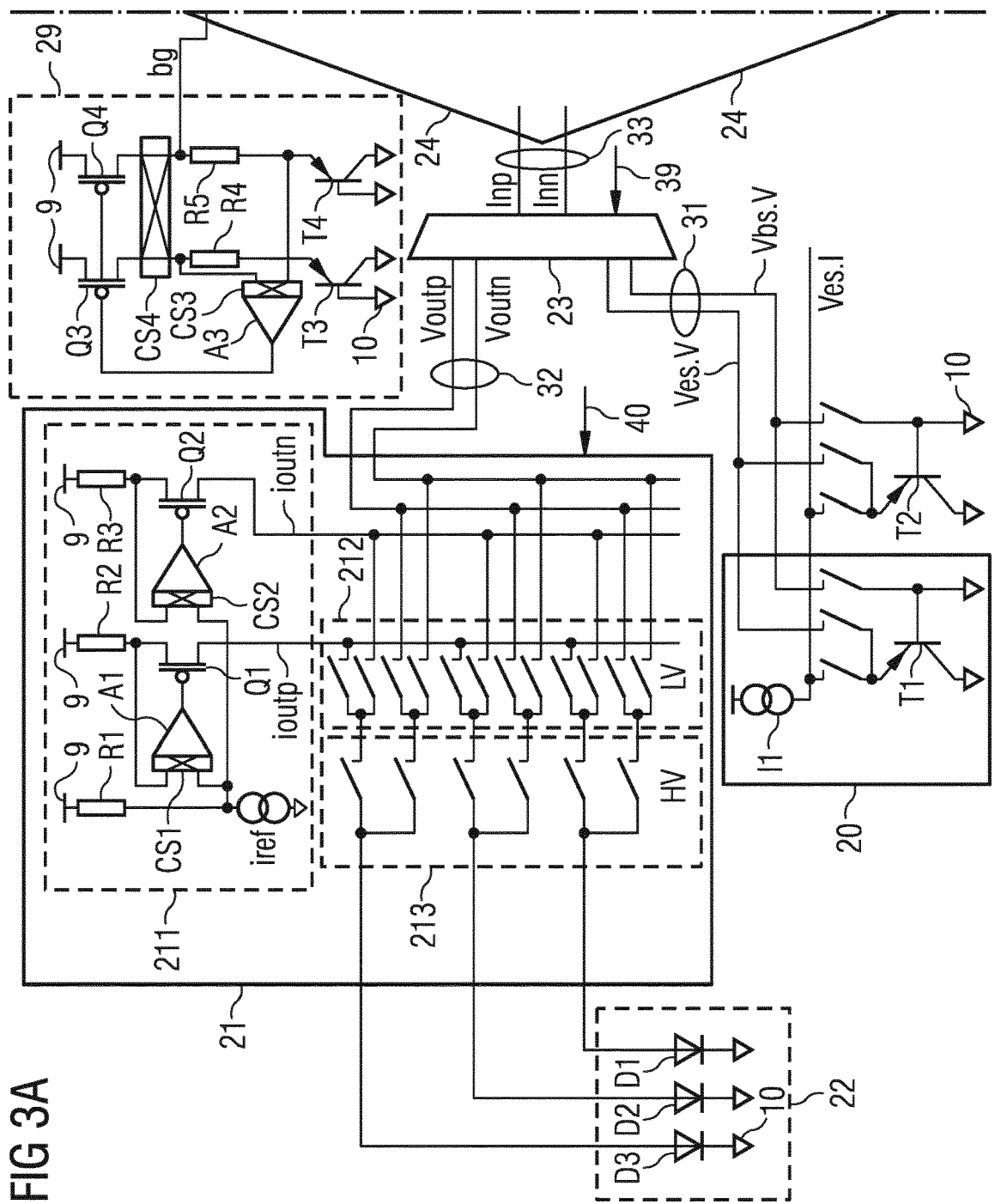

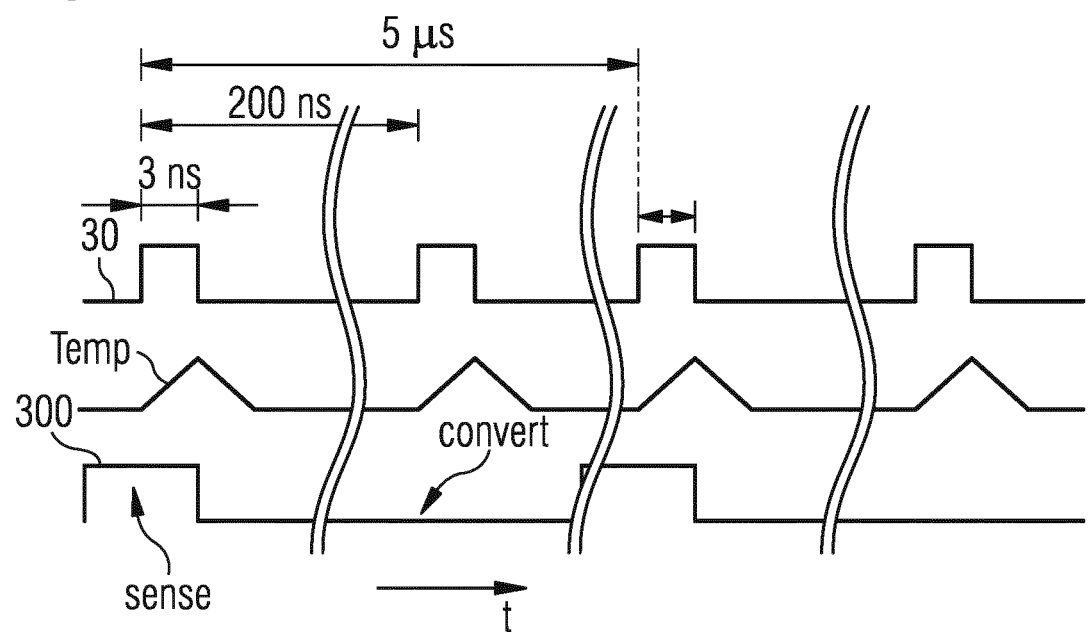

TEMPERATURE SENSOR, LASER CIRCUIT, LIGHT DETECTION AND RANGING SYSTEM AND METHOD

CROSS-REFERENCE TO RELATED APPLICATIONS

The present application is the national stage entry of International Patent Application No. PCT/EP2020/050678, filed on Jan. 13, 2020, and published as WO 2020/148228 A1 on Jul. 23, 2020, which claims the benefit of priority of European Patent Application No. 19151871.1, filed on Jan. 15, 2019, all of which are incorporated by reference herein in their entirety.

BACKGROUND OF THE INVENTION

The present disclosure relates to the field of fast sensing of a temperature of a device powered by a driver circuit which is realized as a switched power supply, for example. Specifically, the application is directed to a temperature sensor, a laser circuit, a light detection and ranging system and a method for temperature sensing.

In some applications, for example in light detection and ranging, LIDAR, high power dissipation occurs during a short amount of time when light is generated and emitted by means of a laser diode. In order to insure that a LIDAR system is always operating within its temperature limits so as not to get damaged, amongst others temperature needs to be monitored. This is especially important since LIDAR is employed in safety critical application scenarios like autonomous driving.

Generally, temperature is considered a slowly changing variable or size. Temperature is measured by means of a suitable temperature sensor which provides an analog signal corresponding to the detected temperature of an object. Said analog signal is converted into a digital signal. An analog-to-digital converter employed in this process is chosen to fulfill the requirements of high precision, moderate speed and power consumption. Known solutions are based on bipolar transistors for sensing the temperature and sigma delta modulators for converting the analog signal.

It turns out that this general approach to temperature sensing is not well suited for applications with high power dissipation during short time intervals leading to considerable temperature spikes. The known approach merely enables measuring the average temperature due to the slow speed of the measurement compared with the high speed of occurring temperature spikes.

An object can therefore be seen in providing a circuit and a method for improving temperature measurement, especially in LIDAR applications.

The object is achieved by the subject-matter of the independent claims. Embodiments and developments are defined in the dependent claims.

SUMMARY OF THE INVENTION

In one embodiment a temperature sensor has a first sensing unit operable to provide a first pseudo-differential unipolar analog signal representing a first temperature value of a power unit, an interface circuit operable to provide a second pseudo-differential unipolar analog signal representing a second temperature value of a powered unit, a multiplexer circuit and a first analog-to-digital converter, ADC, component. The multiplexer circuit is operable to provide a pseudo-differential unipolar multiplexed analog signal comprising the first analog signal or the second analog signal. The first ADC component is operable to provide a first digital signal from the multiplexed analog signal. The first digital signal comprises a digital representation of the first analog signal or the second analog signal. Operation of the first ADC component is synchronized with a control signal designed for activating the power unit.

In the following the expression "operable to" is used as synonym for the expressions "configured to", "designed for" or "prepared to".

The first sensing unit provides the first pseudo-differential unipolar analog signal which represents the first temperature value of the power unit to the multiplexer circuit. The interface circuit provides the second pseudo-differential unipolar analog signal which represents the second temperature value of the powered unit to the multiplexer circuit. The multiplexer circuit provides the pseudo-differential unipolar multiplexed analog signal comprising either the first analog signal or the second analog signal to the first ADC component. The first ADC component performs an analog-to-digital conversion of the multiplexed analog signal which conversion is synchronized in time with the control signal designed for activating the power unit. The first ADC component provides the first digital signal as a result of the conversion. The first digital signal therefore comprises the digital representation of the first or the second analog signal.

Due to operation of the first ADC component in synchrony with the control signal, which in turn controls activation of the power unit for providing power to the powered unit, sensing, i.e. sampling, and analog-to-digital conversion of the first and the second temperature value is synchronized with activation of the power unit and the powered unit, respectively. Consequently, first and/or second temperature values are captured as soon as the power unit is activated and provides power to the powered unit which is the point-in-time where the first temperature value and the second temperature value are near their respective maximum. This detection of maximum values for the first and/or second temperature values improves temperature measurement, especially in LIDAR applications. In such applications a laser diode realizes the powered unit, while a driver of the laser diode realizes the power unit. Temperature spikes occurring within the power unit during activation of the laser diode and temperature spikes occurring within said diode caused by its activation can be detected with the proposed temperature sensor.

The notions 'first temperature value' and 'second temperature value' are used to differentiate between a temperature value of the power unit, which is referred to as the first temperature value and a temperature value of the powered unit which is referred to as the second temperature value.

A pseudo-differential unipolar analog signal designates an analog signal which is related to a basically stable reference signal. In the case that said analog signal comprises a voltage, the pseudo-differential unipolar analog signal is represented by the voltage difference between the actual voltage and a reference voltage which may be ground. The unipolar signal assumes only values either greater than or equal to zero, or equal to zero and below zero.

The powered unit may be connected to the temperature sensor via the interface circuit.

The multiplexer circuit selects one of the analog signals supplied to its inputs, i.e. the first or the second analog signal, and forwards the selected input signal to its single output as the multiplexed analog signal.

In a development the first ADC component comprises a Nyquist frequency ADC, in particular one of the following ADCs: successive approximation ADC, pipeline ADC, algorithmic ADC or flash ADC. The first sensing unit comprises a transistor. In particular the first sensing unit comprises exactly one bipolar transistor.

Use of a Nyquist frequency ADC, for instance a successive approximation ADC, speeds up the temperature sensing by the proposed sensor. Employing just one element for sensing the temperature of the power unit, i.e. one bipolar transistor, further increases the speed of the temperature measurement in the proposed sensor.

In a further development the temperature sensor also comprises a third sensing unit, a second ADC component and a control unit. The third sensing unit is operable to provide a third pseudo-differential unipolar analog signal representing a third temperature value of an integrated circuit comprising the power unit. The integrated circuit is configured to be connected to the powered unit. The second ADC component is operable to provide a second digital signal from the third analog signal, the second digital signal comprising a digital representation of the third analog signal. The control unit is operable to receive the control signal, the first and the second digital signal, to provide a sensor selection signal and an ADC control signal, both in dependence on the control signal, and to provide a calibration signal in dependence on the second digital signal to the first ADC component for calibration of the same. The sensor selection signal is provided to the multiplexer circuit. The ADC control signal is provided to the first ADC component.

The third sensing unit provides the third unipolar analog signal representing the third temperature value of the integrated circuit. The third analog signal is converted by the second ADC component into the second digital signal which comprises the digital representation of the third analog signal or the third temperature value. The control unit generates the sensor selection signal in dependence on the control signal. The sensor selection signal is provided to the multiplexer circuit for controlling the multiplexing operation. The control unit also generates the ADC control signal for controlling the first ADC component. By means of said ADC control signal, operation of the first ADC component is controlled. For example, start of conversion of a value provided with the multiplexed analog signal is synchronized with the control signal which activates the power unit. By means of the sensor selection signal, operation of the multiplexer circuit is controlled accordingly. Furthermore, the control unit generates the calibration signal taking into account information conveyed by the second digital signal.

Said calibration signal is used for calibrating analog-to-digital conversion in the first ADC component.

Sensing the third temperature value by means of the third sensing unit and subsequent conversion of the same into its digital representation using the second ADC component enables monitoring of the average temperature of the integrated circuit. Also, the first ADC component is calibrated using the second digital signal. In particular, a transformation of the digital value determined within the first ADC component into a digital temperature value is calibrated as a function of the second digital signal. This improves the accuracy of the values provided with the first digital signal.

The integrated circuit may be realized in the form of a chip which has, amongst others, the power unit. Said power unit may be realized as a switched mode power supply, for example.

In a development the second ADC component comprises a sigma-delta ADC. The third sensing unit comprises at least two transistors. In particular, said transistors are realized as bipolar transistors.

The sigma-delta ADC, also denoted as delta-sigma ADC or sigma-delta modulator, of the second ADC component provides the second digital signal with high accuracy. Measurement or sampling of the third temperature value representing the temperature of the integrated circuit, is timed such that the average temperature of the integrated circuit can be monitored. In an exemplary implementation, the third temperature value is sampled every 20 milliseconds or during a self-calibration mode.

The third sensing unit is realized by two bipolar transistors, for example, pnp-transistors whose base and collector terminals are respectively coupled to a reference potential terminal and whose emitter terminals are supplied with respective biasing currents. A difference between the emitter voltages of said two transistors is provided as the third analog signal. Said signal is complementary to absolute temperature, CTAT.

In another development the temperature sensor further comprises a second sensing unit operable to detect the second temperature value of the powered unit. The second sensing unit comprises a first diode, wherein a voltage between anode and cathode terminals of said first diode represents the second temperature value. The first diode is in particular realized as a laser diode.

The first diode may be realized as a vertical cavity surface emitting laser, VCSEL, diode. A voltage drop across the diode depends on the temperature of said diode and a current used for biasing the diode. Said voltage drop represents the second temperature value which is supplied via the interface circuit as the second analog signal to the multiplexer circuit.

Using just one electronic component, i.e. the first diode, for sensing the second temperature value increases the speed of the temperature sensor. Thus, a higher sampling rate can be achieved. For example, the second temperature value is sampled every 100 microseconds.

In another development the second sensing unit further comprises a second diode. Therein the first diode is biased with a first current and the second diode is biased with a second current which is a multiple of the first current. A difference in voltage drops across the first and the second diodes therein represents the second temperature value. The second diode in particular comprises a laser diode.

The second diode, like the first diode, may be realized by a VCSEL diode. First and second diodes are biased with first and second currents realizing a defined ratio. In this way, the second temperature value is provided with higher accuracy without compromising sampling rate.

In an exemplary implementation chopping is used when sampling the second temperature value. In detail, in a first sample a difference in voltage drop across first and second diodes is sensed when the first current biases the first diode and the second current biases the second diode. In a second sample, the role of first and second currents is swapped or exchanged, such that the second current biases the first diode and the first current biases the second diode. The ratio between first and second current still remains the same. The difference in voltage drops across the first and second diodes is sampled once again. Both samples are digitized and the control unit provides an average of both samplings and conversions. By this, the impact of a possible mismatch in saturation current of first and second diodes is reduced.

In another development, the second sensing unit represents the powered unit.

Consequently, the powered unit is reused as the second sensing unit. For example, the first and/or second diodes, both realized as VCSELs, are used for detecting their temperature. This achieves space and cost saving in the realization. Furthermore, by means of the synchronization between activating first and second diodes and sensing their temperature enables detecting the peak temperature at the point-in-time where power dissipation is at its maximum. Due to employment of a fast ADC, i.e. the first ADC component realized as successive approximation ADC, said maximum value of the temperature can be correctly monitored.

In a development the interface circuit comprises a biasing circuit and a switching unit. The biasing circuit is operable to generate the first and the second current by means of a chopped voltage to current conversion using a supply voltage. The switching unit comprises a number of low voltage switches and a number of high voltage switches. The high voltage switches are operable to provide the first and second current to a first and a second output of the interface circuit in a switchable manner and to select the first and the second diode. The low voltage switches are operable to provide a first switchable connection between the first current and the first diode and a second switchable connection between the second current and the second diode. Further, the low voltage switches are operable to swap the first and the second switchable connections such that the first switchable connection is between the first current and second diode and the second switchable connection is between the second current and the first diode. The analog signal is thereby provided at the first and second output of the interface circuit.

In this regard, a high voltage designates a range of 5.5 to 50 volts, while a low voltage refers to a range of 0 to 5.5 volts.

The chopped voltage-to-current conversion realized within the biasing circuit in generation of the first and the second currents ensures an accurate ratio between first and second current. By means of the low voltage switches, first and second currents are provided to first and second diodes or vice versa as described above. For connection of first and second currents to the first and second outputs of the interface circuit which is subsequently connected to the multiplexer circuit, the high voltage switches are used which are implemented as bootstrapped switches, in that a field-effect transistor implementing such switch is controlled with a gate voltage which is higher than the employed supply voltage by means of a capacitive circuit known to those skilled in the art.

In a development the first ADC component comprises a first input for receiving a bandgap signal, a second and a third input for receiving the multiplexed analog signal, a reference generation and adjustment circuit, a capacitive switching array, a comparing component, a successive approximation register and a scaling component. The reference generation and adjustment circuit is operable to generate a pseudo-differential unipolar reference signal from the bandgap signal and to adjust a common mode of the reference signal. The capacitive switching array is operable to provide a difference between the multiplexed analog signal and the reference signal. The comparing component is operable to provide a digital bitstream signal depending on the difference between the multiplexed analog signal and the reference signal. The successive approximation register is operable to receive the digital bitstream signal and therefrom provide a digital word signal. The scaling component is connected downstream of the successive approximation register and is operable to provide the first digital signal depending on the control signal.

In the first ADC component in each conversion in the first step the common mode of the reference signal is adjusted to the common mode of the multiplexed analog signal at second and third inputs of the first ADC component. In the next step a difference between the pseudo-differential multiplexed analog signal and the pseudo-differential reference signal is measured by the capacitive switching array and is determined in the comparing component bit by bit and is provided as the digital bitstream signal. The bits of said bitstream signal are stored in the successive approximation register and are also used for control of the capacitive switching array. At the end of each conversion the digital word signal is provided at the output of the successive approximation register. The digital word signal comprises a digital word having a number of bits, e.g. nine bits. The scaling component scales the digital word into a temperature value which is provided with the first digital signal.

In a development the first ADC component further comprises a common mode control unit which is operable to control adjustment of the common mode of the reference signal depending on the multiplexed analog signal and the digital bitstream signal.

By scaling the reference signal to the first ADC component's input range the number of bits used in the ADC can be reduced. This also allows for a smaller input capacitance. For example, a 0.5 K resolution is achieved with only nine bits with the proposed concept.

By means of the common mode control unit the reference signal is common for all possible common mode voltages.

In one embodiment a laser circuit comprises a temperature sensor as defined above and the power unit which is operable to provide power for driving the second sensing unit in dependence on the control signal.

In the proposed laser circuit, the temperature sensor enables to repeatedly sample the temperature of the employed laser diodes at critical times, i.e. shortly after the emission of a light pulse, as well as measurement of the temperature of the diode's driver, called the power unit, which measurements are synchronized with the control signal. By this, temperature peaks can be detected and tracked. Consequently, a temperature over time profile can be measured with much higher sampling rate, for instance a factor of 1000 higher sampling rate for the power unit and a factor of 100 higher sampling rate for the powered unit compared with state of the art. In addition, the temperature of the chip is detected. It can thereby be assured that the laser circuit always operates within the allowed temperature range.

In one embodiment a light detection and ranging, LIDAR, system comprises a laser circuit as specified above. The laser circuit is operable as a laser light source of the LIDAR system.

The laser circuit with the proposed temperature sensor when used in the LIDAR system enable employment of the LIDAR system in safety critical applications, for instance in cars.

In one embodiment a method for temperature sensing comprises the following steps:
  sensing a first temperature value of a power unit and therefrom providing a first pseudo-differential unipolar analog signal,
  performing an analog-to-digital conversion of the first analog signal by means of a first analog-to-digital converter, ADC, component and therefrom providing a first digital signal comprising a digital representation of the first analog signal,
  sensing a second temperature value of a powered unit and therefrom providing a second pseudo-differential unipolar analog signal, performing an analog-to-digital conversion of the second analog signal by means of the first ADC component and therefrom providing the first digital signal comprising a digital representation of the second analog signal, wherein a timing of the analog-to-digital conversion of the first and second analog signal is respectively synchronized with a control signal designed for activating the power unit.

Control of the timing of conversion of the first and second temperature values, i.e. the points-in-time at which the first temperature value of the power unit and the points-in-time at which the second temperature value of the powered unit is measured and sampled, is synchronized with the control signal which is designed for activating the power unit. The power unit in turn provides power to the powered unit, for example, to switch the powered unit on.

Consequently, first and second temperature values are sensed and converted at the critical points-in-time during which power unit and powered unit are active, or directly after activation of power unit and powered unit. At these points-in-time respective temperature values of the power unit and the powered unit reach a maximum. By synchronizing the measurement of first and second temperature values with the activation of the power unit and the powered unit, said maximum temperature values can be detected with the proposed method. Due to using a fast ADC, e.g. a successive approximation ADC in the first ADC component, the proposed temperature sensor is enabled to keep pace with the high sampling frequency. This improves temperature measurement, especially in LIDAR applications in which high temperature values are reached during switch on of the participating laser diodes.

The proposed method may be implemented in the temperature sensor defined above.

In a development the sensing the first temperature value step is executed as soon as a pulse or a sequence of pulses of the control signal occurs. The sensing the second temperature value step is executed in between two pulses or two sequences of pulses of the control signal.

The control signal comprises at least one pulse or at least one sequence of pulses. Said pulses may be realized by current pulses that activate the power unit, for example a driver circuit for VCSELs, which in turn causes the powered unit, for example, at least one VCSEL, to turn on, for example to emit light. Measurement of the temperature of the power unit and provisioning of the first analog temperature value is triggered by occurrence of such pulse. In the case that a sequence of several pulses is used for activating the power unit which drives the powered unit, the first temperature value is sampled during the first pulse in said sequence of pulses. The second temperature value is sensed during a subsequent pulse, i.e. succeeding the first pulse, used for activating the power unit. In the case that a sequence of pulses is used for activating the power unit by means of the control signal, the second temperature value is sensed in a time interval occurring between two sequences of pulses.

In a development the method further comprises before the sensing the first temperature value step:
  sensing a third temperature value of an integrated circuit comprising the power unit, which integrated circuit can be connected to the powered unit, and therefrom providing a third pseudo-differential unipolar analog signal,
  performing an analog-to-digital conversion of the third analog signal by means of a second ADC component and therefrom providing a second digital signal comprising a digital representation of the third analog signal, and
  providing a calibration signal in dependence on the second digital signal for calibrating the first ADC component.

The temperature of the integrated circuit, which comprises the power unit and can be connected to the powered unit, is measured or sampled and is subsequently converted into a digital value which is provided with the second digital signal by the second ADC component, for example by means of a sigma-delta conversion. The digital temperature value determined for the integrated circuit is then used to provide a calibration signal which calibrates conversion within the first ADC component. In detail, transformation of a digital value determined within the first ADC component into a digital temperature value within the first ADC component is calibrated. By this, the first digital signal is provided with higher accuracy. The second digital signal is additionally employed to monitor the average temperature of the integrated circuit.

The text below explains the proposed temperature sensor and the proposed method for temperature sensing in detail using exemplary embodiments with reference to the drawings. Components and circuit elements that are functionally identical or have the identical effect bear identical reference numbers. In so far as circuit parts or components correspond to one additional in function, a description of them will not be repeated in each of the following figures.

BRIEF DESCRIPTION OF THE DRAWINGS

FIG. 4 shows an exemplary timing diagram for the temperature sensor depicted in FIG. 1 during sensing and conversion of the first temperature value.

DETAILED DESCRIPTION

Figure 1:
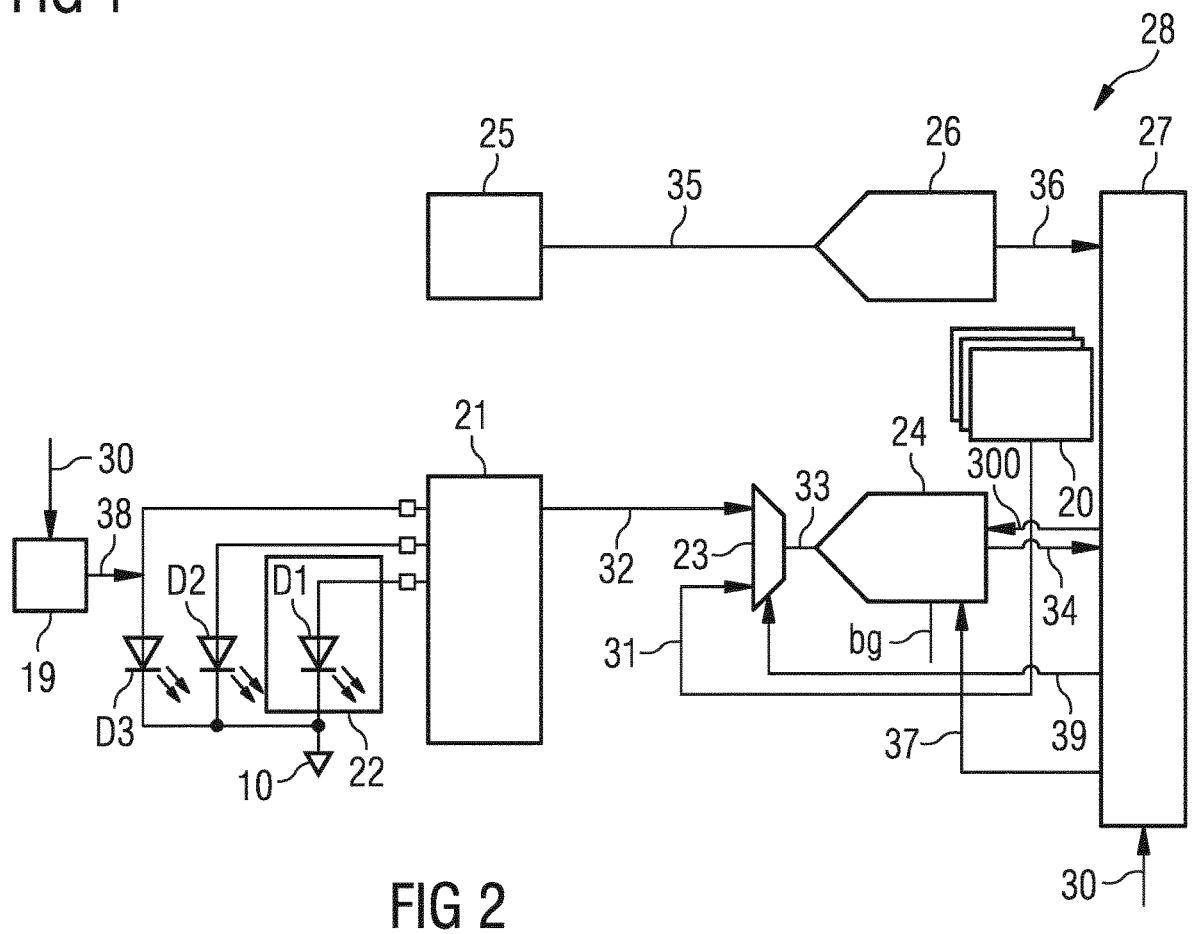
FIG. 1 shows an embodiment example of a temperature sensor and a laser circuit as proposed.

FIG. 1 shows an embodiment example of a temperature sensor and a laser circuit as proposed. The temperature sensor comprises a first sensing unit 20, an interface circuit 21, a multiplexer circuit 23 and a first analog-to-digital converter, ADC, component 24. The first sensing unit 20 is operable to provide a first pseudo-differential unipolar analog signal 31 which represents a first temperature value of a power unit 19. The interface circuit 21 is operable to provide a second pseudo-differential unipolar analog signal 32 which represents a second temperature value of a powered unit 22. The multiplexer circuit 23 is operable to provide a pseudo-differential unipolar multiplexed analog signal 33 which comprises the first analog signal 31 or the second analog signal 32 depending on a sensor selection signal 39. The sensor selection signal 39 is derived from a control signal 30 which is designed for activating the power unit 19. The first ADC component 24 is prepared to provide a first digital signal 34 from the multiplexed analog signal 33. The first digital signal 34 comprises a digital representation of the first analog signal 31 or the second analog signal 32. Operation of the first ADC component 24 is synchronized with the control signal 30. In the presented embodiment example, an ADC control signal 300 is employed which controls operation of the first ADC component 24 to be in synchrony, or in sync, with the control signal 30.

First and second analog signals 31, 32 are provided to the multiplexer circuit 23. Depending on the sensor selection signal 39, the multiplexer circuit 23 forwards either the first or the second analog signal 31, 32 to its output in the form of the multiplexed analog signal 33. The first ADC component 24 performs an analog-to-digital conversion of the multiplexed analog signal 33 and therefrom provides the first digital signal 34. The first digital signal 34 comprises a digital representation of either the first analog signal 31 or the second analog signal 32. The first digital signal 34 comprises a digital temperature value.

Due to the control of the first ADC component 24 operation by means of the ADC control signal 300, which is in sync with the control signal 30 used for activating the power unit 19, activation of the power unit 19 and sampling of the first temperature value by the first sensing unit 20 is coordinated in time with each other. As activation of the power unit 19 enables provisioning of power 38 from the power unit 19 to the powered unit 22, sensing and sampling the second temperature value is also synchronized in time or coordinated in time with the control signal 30 by means of the sensor selection signal 39. Consequently, temperature peaks or maximum values of the first temperature value and the second temperature value can be detected and monitored. This is of special importance in safety critical applications like LIDAR.

In an implementation example, the first ADC component 24 comprises a Nyquist frequency ADC, for instance, a successive approximation ADC.

In an example, the first sensing unit 20 comprises exactly one bipolar transistor. The first unipolar analog signal 31 is consequently represented by a base emitter voltage of said transistor.

Due to the use of just one element for sensing the first temperature value and the employment of the successive approximation ADC in the first ADC component 24, temperature peaks can be sampled and converted into digital values at a high frequency of 200 kHz.

The temperature sensor may further comprise a third sensing unit 25, a second ADC component 26 and a control unit 27. The third sensing unit 25 is operable to provide a third pseudo-differential unipolar analog signal 35 which represents a third temperature value of an integrated circuit comprising the power unit 19. The integrated circuit is prepared to be connected to the powered unit 22. The second ADC component 26 is configured to provide a second digital signal 36 from the third analog signal 35. The second digital signal 36 comprises a digital representation of the third analog signal 35, e.g. a digital temperature value. The control unit 27 is prepared to receive the control signal 30, the first and the second digital signals 34, 36, to provide the ADC control signal 300, the sensor selection signal 39, and to provide a calibration signal 37. The calibration signal 37 is provided in function of the second digital signal 36 to the first ADC component 24. The calibration signal 37 serves for calibration of the first ADC component 24. By means of the third sensing unit 25 an average temperature of the integrated circuit comprising the power unit and the temperature sensor can be monitored. In addition, said average temperature of the integrated circuit is used for calibrating the first ADC component 24, thereby improving the accuracy of the conversion performed in the first ADC component 24. The sensor selection signal 39 is generated by the control unit 27 from the control signal 30, e.g. depending on the occurrence of a pulse or a train of pulses in the control signal 30.

In an exemplary implementation the second ADC component 26 comprises a sigma-delta ADC. This means that the second digital signal 36 is provided with high precision. In an exemplary implementation the third sensing unit 25 comprises at least two bipolar transistors, for example pnp-transistors. A difference between the emitter voltages of said two transistors consequently represents the third analog signal 35. A base emitter voltage of one of said two transistors is used as a reference in the second ADC component 26.

The temperature sensor may also comprise a second sensing unit 22 which is configured to detect the second temperature value of the powered unit 22. As can be gathered from FIG. 1, the second sensing unit 22 represents the powered unit 22. In other words, the powered unit 22 is directly used for sensing or detecting the second temperature value. This increases the speed of the temperature measurement with the proposed temperature sensor and saves space and cost of the implementation. By means of the interface circuit 21, the second temperature value is provided to the multiplexer circuit 23 as the second analog signal 32.

The second sensing unit 22 at least comprises a first diode D1, wherein a voltage between anode and cathode terminals of the first diode D1 represents the second temperature value.

In a further exemplary implementation the second sensing unit 22 comprises the first diode D1 and a second diode D2. In said example, the first diode D1 is biased with a first current, while the second diode D2 is biased with a second current. First and second currents are provided by the interface circuit 21 at a defined ratio such that a level of the second current is a multiple of a level of the first current. A difference in voltage drops across the first and the second diodes D1, D2, i.e. a difference in anode to cathode voltages between the first and the second diodes D1, D2 represents the second temperature value.

First and second diodes may comprise a laser diode each, in particular a VCSEL. Each diode D1, D2 is referred to a reference potential terminal 10. The power unit 19 provides power 38 to the powered unit 22. In particular, the power unit 19 comprises a driver circuit for driving the powered unit 22, i.e. for causing the diodes D1, D2 to emit light at points-in-time which are indicated by pulses provided with the control signal 30.

A laser circuit 28 comprises the temperature sensor as described above, especially the temperature sensor having the control unit 27, first and second ADC components 24, 26, first sensing unit 20, second sensing unit 22, multiplexer circuit 23, third sensing unit 25 and the power unit 19. As described above, the power unit 19 is operable to provide power 38 for driving the second sensing unit 22. In particular, the diodes D1, D2 of the powered unit 22 are driven to emit light in dependence on the control signal 30.

The laser circuit 28 also provides for improved temperature sensing which is able to detect temperature peaks reached during emission of laser light. Consequently, the laser circuit 28 enables monitoring of temperature peaks which is especially important in safety critical LIDAR applications.

As also indicated in FIG. 1, the temperature sensor may comprise more than one first sensing unit 20. Each first sensing unit 20 is prepared to provide an analog signal representing a first temperature value of a monitored power unit. In a case in which more than two laser diodes have to be driven, a suitable number of power units is provided. The temperature of each power unit 19 is consequently sampled and monitored by the proposed temperature sensor.

Figure 2:
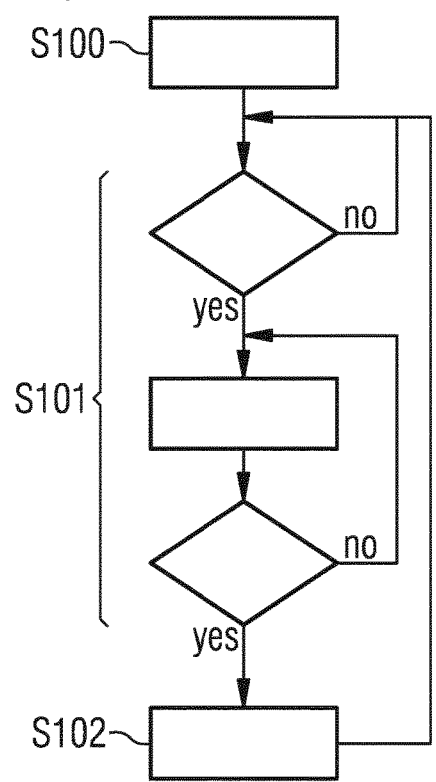
FIG. 2 shows an embodiment example of a method for temperature sensing as proposed.

FIG. 2 shows an embodiment example of a method for temperature sensing as proposed. In the following description the method is applied to the temperature sensor depicted and described with respect to FIG. 1. The method comprises at least the following steps:

S101: Sensing a first temperature value of the power unit 19 and therefrom providing the first analog signal 31, performing an analog-to-digital conversion of the first analog signal 31 by means of the first ADC component 24 and therefrom providing the first digital signal 34 comprising the digital representation of the first analog signal 31, S102: Sensing a second temperature value of the powered unit 22 and therefrom providing the second unipolar analog signal 32, performing analog-to-digital conversion of the second analog signal 32 by means of the first ADC component 24 and therefrom providing the first digital signal 34 comprising the digital representation of the second analog signal 32.

The timing of the steps S101 and S102 is thereby controlled by the sensor selection signal 39 and the ADC control signal 300 which is in sync with the control signal 30 used for activating the power unit 19.

First and second analog signals 31, 32 are multiplexed so that either the first or the second analog temperature value is converted into a digital temperature value in the first ADC component.

In detail, the step S101, i.e. sensing the first temperature value, is executed as soon as a pulse or a sequence of pulses of the control signal 30 occurs or has started. This means that as soon as the power unit 19 receives a first pulse or a first sequence of pulses with the control signal 30, the temperature of the power unit 19 is sensed by means of the first sensing unit 21 as of FIG. 1.

The step S102 is executed in between two pulses or in between two sequences of pulses of the control signal 30. This means that the temperature of the laser diodes or VCSELs D1, D2 is sampled or detected shortly after activation or emission of light by said diodes has terminated. In an exemplary implementation a power-down mode of first and second diodes D1, D2 is used for sampling the second temperature value.

Thereby, temperature peaks within the power unit 19 and within the powered unit 22 can be detected. Conversion of the detected analog temperature values into digital values in the form of the digital signal 34 is performed subsequent to the sampling of the first and second analog signals 31, 32 in a multiplexed manner as described above. Due to the use of a fast ADC in the first ADC component 24, for instance a successive approximation ADC, a high sampling frequency can be achieved.

In an exemplary realization, the method may further comprise the step S100: Sensing a third temperature value of an integrated circuit comprising the power unit 19 and therefrom providing the third analog signal 35, performing an analog-to-digital conversion of the third analog signal 35 by means of the second ADC component 26 and therefrom providing the second digital signal 36 comprising the digital representation of the third analog signal 35, providing the calibration signal 37 in dependence on the second digital signal 36 for calibrating the first ADC component 24.

Step S100 is executed before steps S101 and S102 to take advantage of the calibration of the analog-to-digital conversion in the first ADC component 24. Thereby, the average temperature of the chip or integrated circuit which implements the power unit and the temperature sensor is taken into account when subsequently detecting and measuring the temperature of the power unit and the powered unit to improve their accuracies.

Figure 3B:
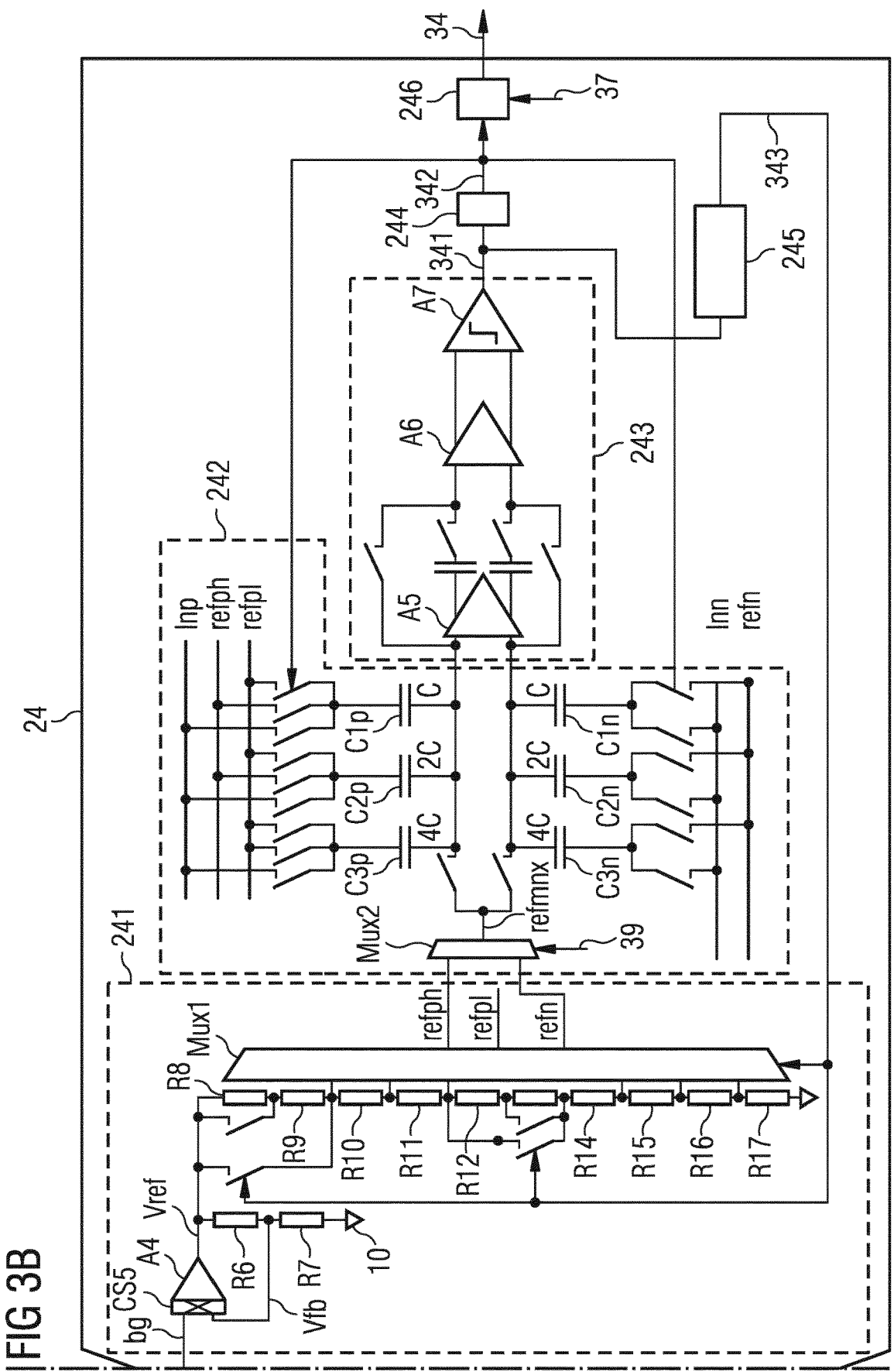
FIG. 3 shows an exemplary circuit diagram representing an implementation example of the temperature sensor of FIG. 1.

FIG. 3 shows an exemplary circuit diagram representing an implementation example of the temperature sensor of FIG. 1. As indicated in the figure and due to its size, FIG. 3 is split up into two parts, namely FIG. 3A and FIG. 3B.

FIG. 3A depicts the first sensing unit 20, the interface circuit 21, the second sensing unit 22, the multiplexer circuit 23 and a reference generation circuit 29, as well as the input side of the first ADC component 24. In the depicted example the sensing unit 22 comprises three diodes D1, D2, D3, all of which are connected to the reference potential terminal 10 and to the interface circuit 21. The interface circuit 21 comprises a biasing circuit 211 and a switching unit 212, 213. The biasing circuit 211 is operable to generate a first current ioutp and a second current ioutn which are provided to the switching unit 212, 213. The biasing circuit 211 comprises resistors R1, R2 and R3, all of which are connected to a supply terminal 9 at which a supply voltage is provided. Resistor R2 is implemented with a multiple or fraction of the resistance of resistor R1, for example twice the resistance of resistor R1. Resistor R3 is implemented using a multiple of the resistance of resistor R2, for example four times the resistance of resistor R2. The biasing circuit 211 further comprises a current source for providing a reference current iref, a first and a second amplifier A1, A2 and field-effect transistors Q1 and Q2. The inputs of amplifier A1 are connected to a chopper switch CS1 which enables swapping of the inverting and non-inverting input of amplifier A1 and its output node. One input of chopping switch CS1 is connected to a connection point between resistor R2 and one terminal of transistor Q1. The second input of chopper switch CS1 is connected to the current source for supplying the reference current iref. An output of amplifier A1 is connected to a base terminal of transistor Q1. At an output terminal of transistor Q1 the first current ioutp is provided. The inputs of amplifier A2 are likewise connected to chopper switch CS2. One input of chopper switch CS2 is connected to a connection point between resistor R3 and one terminal of transistor Q2, while the other input of chopper switch CS2 is connected to the current source providing the reference current iref. An output of amplifier A2 is connected to a base terminal of transistor Q2. The second current ioutn is provided at an output terminal of transistor Q2.

Operation of the interface circuit 21, i.e. the biasing circuit 211 and switching unit 212, 213, is controlled by a chopper signal 40 which is generated by the control unit 27 in dependence on the sensor selection signal 39.

The biasing circuit 211 generates the first and the second current ioutp, ioutn by means of a chopped voltage to current conversion using the supply voltage at the supply potential terminal 9 and the reference current iref. Thereby, a fixed ratio between first and second currents ioutp, ioutn is realized. In the depicted example a ratio of four is realized. First and second currents are used for biasing diodes D1, D2, and D3 of the second sensing unit 22.

The switching unit comprises a number of low voltage, LV, switches 212 and a number of high voltage, HV, switches 213. The HV switches 213 are configured to provide the first and the second current ioutp, ioutn as well as Voutp, Voutn to a first and a second output of the interface circuit 21 in a switchable manner controlled by the chopper signal 40. Furthermore, the HV switches 213 are configured to select one pair of diodes from diodes D1, D2 and D3. The LV switches 212 under control of the chopper signal 40 are configured to provide a first switchable connection between the first current ioutp and one of diodes D1, D2, D3, for example to the first diode D1. A second switchable connection is provided by the LV switches 212 between the second current ioutn and another diode out of diodes D1, D2, D3, for example the second diode D2. The LV switches 212 are further configured to swap the first switchable connection and the second switchable connection such that the first switchable connection is between the first current ioutp and the second diode D2 and such that the second switchable connection is between the second current ioutn and the first diode D1. Consequently, each diode of the selected pair of diodes is once biased with the lower first current ioutp and then with the higher second current ioutn. Potential impact of a mismatch in diode saturation current is thus reduced. During a period in which the second analog signal 32 is not sampled, e.g. during sampling of the first analog signal 31, connections of first and second currents ioutp, ioutn are shorted to reduce settling time of Voutp and Voutn.

The second analog signal 32 is provided at the output of the interface circuit 21. The second analog signal 32 has a first component Voutp and a second component Voutn which may both comprise a voltage. The first component Voutp therein corresponds to a voltage at an anode terminal of the diode which is selected by the HV switches 213 and provided with the first current ioutp by the LV switches 212. The second component Voutn represents a voltage at the anode terminal of the second diode of the pair of diodes used for sensing in the second sensing unit 22 which is selected by means of the HV switches 213 and is provided with the second current ioutn by means of the LV switches 212. In other words, from the number of diodes D1, D2, D3 which are connected to the interface circuit 21 and which may be realized as VCSELs two are selected at a time. Two currents ioutp, ioutn with a fixed ratio are biasing the selected VCSELs. A difference between the voltages Voutp, Voutn is a measure for the temperature of the VCSELS.

Thus, for each measurement two values of the second analog signal 32 are provided and converted by employing the first and the second switchable connection swapping the roles of the first and the second current ioutp, ioutn in biasing the selected pair of diodes. The temperature is determined as the average between the first and the second value.

The first sensing unit 20 has exactly one transistor T1 and a current source I1 for biasing the transistor T1. The first analog signal 31 is consequently realized as a base emitter voltage of the first transistor T1 and represents the temperature of said transistor T1. As the transistor T1 is mounted close to the power unit which powers diodes D1, D2, D3 the first analog signal represents analog temperature values of the power unit. The first analog signal 31 has a first component Ves.V representing the emitter voltage and a second component Vbs.V representing the base voltage of transistor T1.

In an alternative solution, the first sensing unit has a second transistor T2 which is also biased by the current source I1. In that alternative the first analog signal 31 is provided as the difference in emitter voltages between the first and the second transistor T1, T2.

First and second analog signals 31, 32 are provided to respective inputs of the multiplexer circuit 23. Under control of the sensor selection signal 39 the multiplexer circuit 23 provides either first and second component Voutp, Voutn of the second analog signal 32 or first and second component Ves.V and Vbs.V of the first analog signal 31 as the multiplexed analog signal 33 to its output. The multiplexed analog signal 33 has a first component Inp and a second component Inn.

The reference generation unit 29 has field-effect transistors Q3 and Q4, an amplifier A3 with a chopper switch CS3 connected to its inputs, resistors R4 and R5, bipolar transistors T3 and T4 and chopper switch CS4. Transistors Q3 and Q4 are connected to a supply terminal 9. The base terminals of transistors Q3 and Q4 are both connected to an output of amplifier A3. An output terminal of transistor Q3 is connected to one input of chopper switch CS4, while an output terminal of transistor Q4 is connected to the other input of chopper switch CS4. One output of chopper switch CS4 is connected via resistor R4 to on input of chopper switch CS3 and to an emitter terminal of transistor T3. The second output of chopper switch CS4 is connected via resistor R5 to a second input of chopper switch CS3 and to an emitter terminal of transistor T4. Base and collector terminals of transistors T3 and T4 are connected to the reference potential terminal 10. At the second output terminal of the chopper switch CS4 a bandgap signal bg is provided, for example as a bandgap voltage, to the first ADC component 24.

The bandgap signal bg is, for example, provided as a temperature stable voltage with very little first order dependency over temperature.

FIG. 3B shows a detailed implementation example of the first ADC component 24. The first ADC component 24 comprises a first input for receiving the bandgap signal bg, a second and a third input for receiving the multiplexed analog signal 33, i.e. its first and second components Inp and Inn, a reference generation and adjustment circuit 241, a capacitive switching array 242, a comparing component 243 and a successive approximation register 244.

The reference generation and adjustment circuit 241 has an amplifier A4 with a chopper switch CS5 connected to its inputs, a first multiplexer Mux1 and a number of resistors R6 to R17. One input of chopper switch CS5 receives the bandgap signal bg while the other input of chopper switch CS5 receives a feedback voltage Vfb. At the output of amplifier A4 a reference voltage Vref is provided. A resistor divider having resistors R6 and R7 is connected to the output of amplifier A4 and to the reference potential terminal 10. The feedback voltage Vfb is provided at a connection point between resistors R6 and R7. All resistors R6 to R17 are dimensioned with basically equal resistances. The first multiplexer Mux1 receives the reference voltage Vref via certain tabs realized by the serial connection having resistors R8, R9, R10, R11, R12, R13, R14, R15, R16 and R17. Said serial connection of resistors is connected in a switchable manner between the output of amplifier A4 and the reference potential terminal 10. Under control of a common mode control signal 343 which will be described in detail below, the first multiplexer Mux1 generates a pseudo-differential unipolar reference signal having the three component refn, refph and refpl from the reference voltage Vref by suitable selection of tabs within the serial connection of resistors.

The capacitive switching array 242 has a second multiplexer Mux2, capacitors $C3p$, $C2p$, $C1p$, $C3n$, $C2n$ and $C1n$, as well as a number of switches as depicted in FIG. 3B. Operation of said switches is controlled by a digital word signal 342 provided at the output of the successive approximation register 244 and by the ADC control signal 300. The second multiplexer Mux2 receives the reference signal components refn and refph and therefrom provides a multiplexed reference signal refmux under control of the sensor selection signal 39. The capacitance values of said capacitors used in the switching array 242 are scaled as indicated in FIG. 3B. For instance, the capacitance value of capacitor C1p corresponds to the value C, while the capacitance of the capacitor C2p corresponds to the value of two times the value C. The lower plates of capacitors C1p, C2p and C3p are connected to each other and to one input, preferably a non-inverting input, of the comparing component 243. Said connection of lower plates of capacitors C1p, C2p and C3p is supplied with the multiplexed reference signal refmux in a switchable manner. The upper plates of capacitors C1p, C2p and C3p are each respectively coupled to either an input which is supplied with the first component Inp of the multiplexed analog signal 33 or to an input which is supplied with the component refph of the reference signal, or to an input which is supplied with the component refpl of the reference signal in a switchable manner.

In an analogous way, the lower plates of capacitors C1n, C2n and C3n are each coupled either to an input which is supplied with the second component Inn of the multiplexed analog signal 33 or to an input which is supplied with the component refn of the reference signal in a switchable manner. The upper plates of capacitors C1n, C2n and C3n are connected to each other and to the other input, preferably an inverting input, of the comparing component 243. Said connection of upper plates of capacitors C1n, C2n and C3n is supplied with the multiplexed reference signal refmux in a switchable manner.

The capacitors C3p and C3n having the highest capacitance value are used for determining the most significant bit, MSB, of the multiplexed analog signal 33. Capacitors C1p and C1n having the lowest capacitance value are used to determine the least significant bit, LSB, of the multiplexed analog signal 33.

The comparing component 243 has two preamplifiers A5, and A6 and a comparator A7 at the output of which a digital bitstream signal 341 is provided. The bitstream signal 341 comprises bits according to the decisions of the comparator A7. Preamplifier A5 is capacitively coupled to preamplifier A6. The capacitive coupling between the preamplifiers A5 and A6 achieves offset cancellation and a dynamic comparator A7. Consequently, that the comparing component only consumes current on the clock edges. Amplifier A5 is enabled whenever the second analog signal 32 is converted in the first ADC component 24. Preamplifier A5 is disabled whenever the first analog signal 31 is converted.

The capacitive switching array 242 together with the comparing component 243 implement a binary search algorithm in the successive approximation analog-to-digital conversion known to those skilled in the art. This allows measuring a pseudo-differential analog signal against a pseudo-differential reference signal or voltage. The output of the comparing component 243, i.e. the digital value 341, is provided as a ratio μ which is given by the following formula:

$$\mu = \frac{V_{inp} - V_{inn} - (V_{refpl} - V_{refn})}{V_{refph} - V_{refpl}}$$

Therein, μ represents the ratio μ, $V_{inp}$ represents the voltage of the first component Inp of the multiplexed analog signal 33, $V_{inn}$ represents the voltage of the second component Inn of the multiplexed analog signal 33, $V_{refpl}$ represents a voltage of the refpl component of the reference signal, $V_{refn}$ refers to the voltage of the refn component of the reference signal and $V_{refph}$ refers to the refph component of the reference signal.

Figure 6:
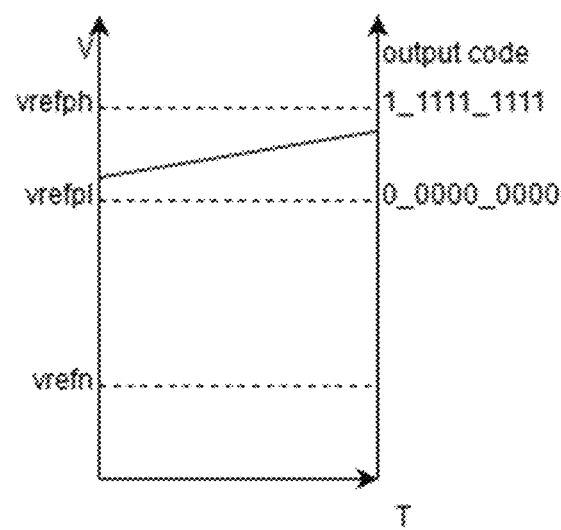
FIG. 6 shows a voltage V of the first or second analog signal with respect to temperature.

Accordingly, a voltage of the first or second analog signal 31, 32 is converted into a digital word as depicted in the diagram shown in FIG. 6.

The diagram shows a voltage V of the first or second analog signal 31, 32 with respect to a temperature T representing the first or the second temperature value and the corresponding output code, representing a nine bit word of the digital word signal.

As shown in FIG. 3B, the successive approximation register 244 receives and stores the digital values received with the digital bitstream signal 341 and therefrom provides the digital word signal 342.

The first ADC component further comprises a scaling component 246 which is connected downstream of the successive approximation register 244. The scaling component 246 is configured to scale the digital word signal 342 and to provide the first digital signal 34. For this, the scaling component 246 transforms the digital word signal 342 into a temperature value which is provided as the first digital signal 34, for instance in the form of a 9-bit word. The calibration signal 37, which is provided by the control unit 27 as depicted in FIG. 1, is used for calibrating said transformation according to the temperature measured for the integrated circuit, which is measured with high accuracy.

The first ADC component 24 further comprises a common mode control unit 245 which is configured to provide the common mode control signal 343 for controlling adjustment of the common mode of the reference signal refn, refph and refpl depending on the multiplexed analog signal 33 and the digital bitstream signal 341. In detail, each time the multiplexer component 23 provides a new value for the second analog signal 32 in the form of signal components Inn and Inp, the common mode of the reference signal refn, refph, refpl is adjusted by means of the reference generation and adjustment circuit 241, the capacitive switching array 242, the comparing component 243 and the common mode control unit 245. Therein, a voltage level of the refn component of the reference signal is adjusted by suitable connection of the tabs of the series connection of resistors providing inputs to the first multiplexer Mux1 so that the voltage of the refn reference signal component is adjusted to a voltage of the Inn component of the multiplexed analog signal 33. By this common mode shift a voltage level of the components of the pseudo-differential reference signal refn, refpl, refph is shifted under control of the common mode control unit 245.

As soon as the common mode is adjusted, the difference between the two components Inn and Inp of the multiplexed analog signal is converted by comparison with the different components of the reference signal refn, refph and refpl.

By scaling the references of the first ADC component 24 to its input range, the number of bits used in the analog-to-digital conversion can be reduced. This also allows for a smaller input capacitance. In this implementation example 0.5 K resolution is achieved with only nine bits.

FIG. 4 shows an exemplary timing diagram for the temperature sensor depicted in FIG. 1 during a typical sensing and conversion of the first temperature value. With reference to time t the following is shown: The control signal 30 in the first line, resulting temperature of the power unit in the second line and corresponding sampling and converting phases in the first ADC component according to the ADC control signal 300 in the third line. The control signal 30 has, for example, current pulses of a duration of 3 nanoseconds every 200 ns. Due to the activation of the power unit by the control signal 30 its temperature rises during said current pulses and decreases at the end of said current pulses. The temperature of the power unit is sensed or sampled by means of the first sensing unit during a current pulse of the control signal 30. At the end of the current pulse the value of the first analog signal sensed is converted into a digital value in the first ADC component by toggling the ADC control signal 300. Said sampling and conversion is repeated, for example every five microseconds.

Figure 5:
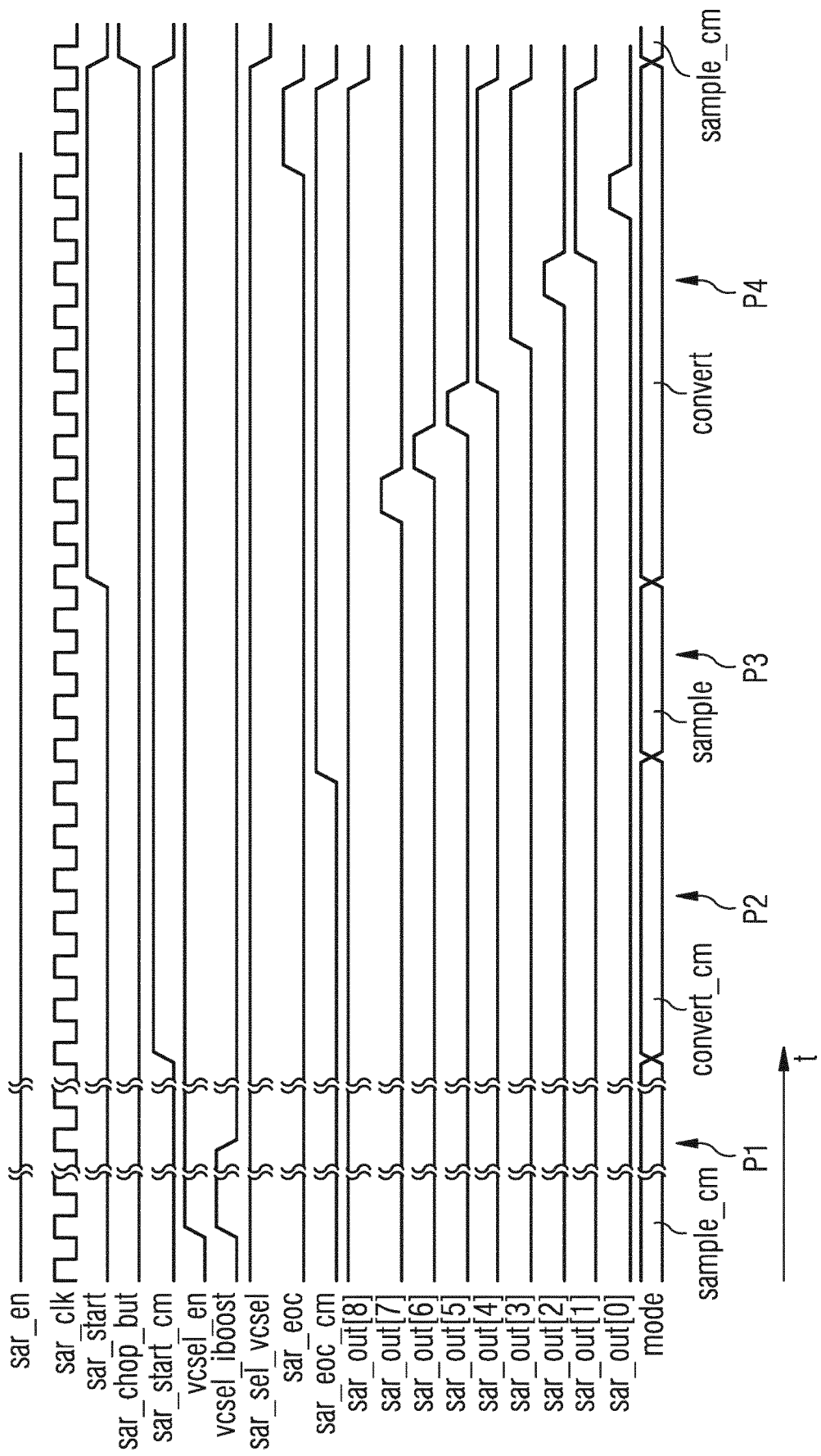
FIG. 5 shows exemplary timing diagrams for the temperature sensor depicted in FIG. 1 during sensing and conversion of the second temperature value.

FIG. 5 shows timing diagrams for the temperature sensor depicted in FIGS. 1 and/or 3 during sensing and conversion of the second temperature value. All signals are depicted in relation to time t. In the depicted diagram the temperature of a connected VCSEL is sensed and converted. From the signal in the bottom line called "mode" it can be seen that the process of determining the temperature of a VCSEL has four phases P1, P2, P3 and P4. By means of the signal vcsel iboost in the seventh line one of the diodes D1 to D3 in FIG. 1 is biased for sensing the second temperature value. According to the bottom line, first of all in phases P1 and P2 the common mode voltage of the reference signal refn, refpl and refph is adjusted to the common mode voltage of the second analog signal 32 representing the temperature of the VCSEL which is to be converted in phases P3 and P4. At the end of phase P2 the adjustment of the common mode voltage of the reference signal is completed. Subsequently, the second analog signal is sampled in phase P3 and is converted in phase P4. The successive approximation algorithm implemented in the first ADC component 24, especially in the capacitive switching array 242 and the comparing unit 243 can be clearly seen from the signals sar_out(8) to sar_out(0). At the end of phase P4 the digital value of the temperature of the VCSEL is provided.

In detail, for conversion of each second temperature value provided with the second analog signal 32, first the suitable common mode voltage of the reference signal is determined in a binary search algorithm. Subsequently, the pseudo-differential second analog signal 32 is converted a first time using the adapted reference signal. Next the connections of ioutn and ioutp are swapped within the interface circuit 21 and the diodes under measurement are biased with an inverted current ratio. The second analog signal 32 is converted a second time using the adapted reference signal. The final value provided with the digital signal 34 comprises the average of the result of the first and the second measurement.

It is to be understood that any feature described in relation to any one embodiment may be used alone, or in combination with other features described, and may also be used in combination with one or more features of any other of the embodiments, or any combination of any other of the embodiments unless described as alternative. Furthermore, equivalents and modifications not described above may also be employed without departing from the scope of the temperature sensor and the method for temperature sensing as defined in the accompanying claims.

The invention claimed is:

1. A temperature sensor having a first sensing unit operable to provide a first pseudo-differential unipolar analog signal representing a first temperature value of a power unit,
   an interface circuit operable to provide a second pseudo-differential unipolar analog signal representing a second temperature value of a powered unit,
   a multiplexer circuit which is operable to provide a pseudo-differential unipolar multiplexed analog signal comprising the first pseudo-differential unipolar analog signal or the second pseudo-differential unipolar analog signal depending on a sensor selection signal, and
   a first analog-to-digital converter, ADC, component operable to provide a first digital signal from the pseudo-differential unipolar multiplexed analog signal, the first digital signal comprising a digital representation of the first analog signal or the second analog signal, wherein operation of the first ADC component is synchronized with a control signal designed for activating the power unit, wherein
   the sensor selection signal is derived from the control signal, the control signal activating the power unit, wherein the first and/or the second temperature value are sensed and analog-to-digital converted when the first and/or the second temperature are at their respective maxima, and
   each pseudo-differential unipolar analog signal designates an analog signal associated with a substantially stable reference signal.

2. The temperature sensor according to claim 1, wherein the first ADC component comprises a Nyquist frequency ADC, and wherein the first sensing unit comprises a transistor.

3. The temperature sensor according to claim 1 further comprising
   a third sensing unit operable to provide a third pseudo-differential unipolar analog signal representing a third temperature value of an integrated circuit comprising the power unit, the integrated circuit being operable to be connected to the powered unit,
   a second ADC component which is operable to provide a second digital signal from the third analog signal, the second digital signal comprising a digital representation of the third analog signal, and
   a control unit which is operable to receive the control signal, the first and the second digital signal, to provide the sensor selection signal to the multiplexer circuit and to provide an ADC control signal to the first ADC component, the sensor selection signal and the ADC control signal both depending on the control signal, and to provide a calibration signal in dependence on the second digital signal to the first ADC component for calibration of the same.

4. The temperature sensor according to claim 3, wherein the second ADC component comprises a sigma-delta ADC, and
   wherein the third sensing unit comprises at least two transistors.

5. The temperature sensor according to claim 1 further comprising
   a second sensing unit operable to detect the second temperature value of the powered unit, the second sensing unit comprising a first diode, wherein a voltage between anode and cathode terminals of the first diode represents the second temperature value.

6. The temperature sensor according to claim 5, wherein the second sensing unit further comprises a second diode, the first diode being biased with a first current, the second diode being biased with a second current being a multiple of the first current, wherein a difference in voltage drops across the first and the second diodes represents the second temperature value.

7. The temperature sensor according to claim 6, wherein the interface circuit comprises a biasing circuit operable to generate the first and the second current by means of a chopped voltage to current conversion using a supply voltage, a switching unit comprising a number of low-voltage switches and a number of high-voltage switches, the high-voltage switches being operable to provide the first and the second current to a first and a second output of the interface circuit in a switchable manner and to select the first and the second diode, and the low-voltage switches being operable to provide a first switchable connection between the first current and the first diode and a second switchable connection between the second current and the second diode, the low-voltage switches being further operable to swap the first and the second switchable connections such that the first switchable connection is between the first current and the second diode and the second switchable connection is between the second current and the first diode, wherein the second analog signal is provided at the first and second output of the interface circuit.

8. The temperature sensor according to claim 5,
wherein the second sensing unit represents the powered unit.

9. A laser circuit comprising
the temperature sensor according to claim 5 and
the power unit which is operable to provide power for driving the second sensing unit in dependence on the control signal.

10. A light detection and ranging, LIDAR, system, comprising the laser circuit according to claim 9, the laser circuit being operable as a laser light source of the LIDAR system.

11. The temperature sensor according to claim 1,
wherein the first ADC component comprises
a first input for receiving a bandgap signal,
a second and a third input for receiving the multiplexed analog signal a reference generation and adjustment circuit operable to generate a pseudo-differential unipolar reference signal from the bandgap signal and to adjust a common mode of the reference signal,
a capacitive switching array operable to provide a difference between the multiplexed analog signal and the reference signal,
a comparing component operable to provide a digital bitstream signal depending on the difference between the multiplexed analog signal and the reference signal,
a successive approximation register operable to receive the digital bitstream signal and therefrom provide a digital word signal, and
a scaling component operable to scale the digital word signal and to provide the first digital signal therefrom.

12. The temperature sensor according to claim 11,
wherein the first ADC component further comprises a common mode control unit operable to control adjustment of the common mode of the reference signal depending on the multiplexed analog signal and the digital bitstream signal.

13. A method for temperature sensing comprising:
sensing a first temperature value of a power unit and therefrom providing a first pseudo-differential unipolar analog signal,
performing an analog-to-digital conversion of the first analog signal by means of a first analog to digital converter, ADC, component and therefrom providing a first digital signal comprising a digital representation of the first analog signal, sensing a second temperature value of a powered unit and therefrom providing a second pseudo-differential unipolar analog signal,
performing an analog-to-digital conversion of the second analog signal by means of the first ADC component and therefrom providing the first pseudo-differential unipolar digital signal comprising a digital representation of the second pseudo-differential unipolar analog signal depending on a sensor selection signal,
wherein a timing of the analog-to-digital conversion of the first and second analog signal is respectively synchronized with a control signal designed for activating the power unit, wherein
the sensor selection signal is derived from the control signal, the control signal activating the power unit, wherein the first and/or the second temperature value are sensed and analog-to-digital converted the first and/or the second temperature are at their respective maxima, and each pseudo-differential unipolar analog signal designates an analog signal associated with a substantially stable reference signal.

14. The method according to claim 13,
wherein the sensing the first temperature value step is executed as soon as a pulse or a sequence of pulses of the control signal occurs, and
wherein the sensing the second temperature value step is executed in between two pulses or two sequences of pulses of the control signal.

15. The method according to claim 13,
further comprising before the sensing the first temperature value step:
sensing a third temperature value of an integrated circuit comprising the power unit, which integrated circuit can be connected to the powered unit, and therefrom providing a third pseudo-differential unipolar analog signal, and
performing an analog-to-digital conversion of the third analog signal by means of a second ADC component and therefrom providing a second digital signal comprising a digital representation of the third analog signal, and
providing a calibration signal in dependence on the second digital signal for calibrating the first ADC component.

16. A temperature sensor having
a first sensing unit operable to provide a first pseudo-differential unipolar analog signal representing a first temperature value of a power unit,
an interface circuit operable to provide a second pseudo-differential unipolar analog signal representing a second temperature value of a powered unit,
a multiplexer circuit which is operable to provide a pseudo-differential unipolar multiplexed analog signal comprising the first pseudo-differential unipolar analog signal or the second pseudo-differential unipolar analog signal, and
a first analog-to-digital converter, ADC, component operable to provide a first digital signal from the pseudo-differential unipolar multiplexed analog signal, the first digital signal comprising a digital representation of the first analog signal or the second analog signal, wherein operation of the first ADC component is synchronized with a control signal designed for activating the power unit,
a third sensing unit operable to provide a third pseudo-differential unipolar analog signal representing a third temperature value of an integrated circuit comprising the power unit, the integrated circuit being operable to be connected to the powered unit, a second ADC component which is operable to provide a second digital signal from the third analog signal, the second digital signal comprising a digital representation of the third analog signal, and a control unit which is operable to receive the control signal, the first and the second digital signal, to provide the sensor selection signal to the multiplexer circuit and to provide an ADC control signal to the first ADC component, a sensor selection signal and the ADC control signal both depending on the control signal, and to provide a calibration signal in dependence on the second digital signal to the first ADC component for calibration of the same, wherein each pseudo-differential unipolar analog signal designates an analog signal associated with a substantially stable reference signal.

\* \* \* \* \*